United States Patent
Choe et al.

(10) Patent No.: US 10,126,336 B2
(45) Date of Patent: Nov. 13, 2018

(54) ENERGY USAGE DEVICE AND ENERGY INFORMATION COLLECTING DEVICE

(71) Applicant: Encored Technologies, Inc., Seoul (KR)

(72) Inventors: Jong-Woong Choe, Seoul (KR); Hyunsu Bae, Seoul (KR); Junhan Ahn, Seoul (KR)

(*) Notice: Subject to any disclaimer, the term of this patent is extended or adjusted under 35 U.S.C. 154(b) by 137 days.

(21) Appl. No.: 14/912,280

(22) PCT Filed: Aug. 12, 2014

(86) PCT No.: PCT/KR2014/007469
§ 371 (c)(1),
(2) Date: Feb. 16, 2016

(87) PCT Pub. No.: WO2015/026094
PCT Pub. Date: Feb. 26, 2015

(65) Prior Publication Data
US 2016/0187398 A1 Jun. 30, 2016

(30) Foreign Application Priority Data
Aug. 19, 2013 (KR) ........................ 10-2013-0097789

(51) Int. Cl.
*G01R 21/00* (2006.01)
*G01R 21/133* (2006.01)
*G01D 4/00* (2006.01)

(52) U.S. Cl.
CPC ........... *G01R 21/133* (2013.01); *G01D 4/004* (2013.01); *Y02B 90/242* (2013.01); *Y02B 90/244* (2013.01);
(Continued)

(58) Field of Classification Search
CPC .................................................. G01R 11/00
(Continued)

(56) References Cited

U.S. PATENT DOCUMENTS

| | | |
|---|---|---|
| 2011/0153108 A1 | 6/2011 | Yoon et al. |
| 2012/0221164 A1 | 8/2012 | Igata |
| 2014/0044200 A1 | 2/2014 | Soma et al. |

FOREIGN PATENT DOCUMENTS

| | | |
|---|---|---|
| JP | 2012239111 A | 12/2012 |
| KR | 1020110070748 A | 6/2011 |
| WO | 2011058761 A1 | 5/2011 |

OTHER PUBLICATIONS

Korea Intellectual Property Office, International Search Report, Int'l App. No. PCT/KR20141007469, dated Oct. 23, 2014, Daejeon, Korea.

*Primary Examiner* — Anthony Ho
(74) *Attorney, Agent, or Firm* — John H. Choi & Associates LLC (57) ABSTRACT

The present invention relates to a configuration of a device using energy, and an energy usage device according to the present invention includes: an energy information generating unit configured to generate energy information containing energy use information measured for an energy usage device or generated in consideration of operations of particular configurations of the device; a communication unit configured to transmit the generated energy information or an identification code for identifying the device to an energy information collecting device; and a control unit configured to control an operation of the energy information generating unit, the communication unit, or the device. According to the present invention, it is possible to expand an active energy saving solution infrastructure due to ease in extracting and controlling energy use information.

18 Claims, 5 Drawing Sheets

(52) U.S. Cl.
CPC ............ *Y02B 90/248* (2013.01); *Y04S 20/322* (2013.01); *Y04S 20/327* (2013.01); *Y04S 20/52* (2013.01)

(58) Field of Classification Search
USPC .......................................................... 702/62
See application file for complete search history.

| Identification mode | Power amount | Other energy information | Device operation mode |

ENERGY USAGE DEVICE AND ENERGY INFORMATION COLLECTING DEVICE

TECHNICAL FIELD

The present invention relates to a configuration of a device using energy, and more particularly, to an energy usage device, which is equipped with an energy measuring module and generates energy use information.

BACKGROUND ART

The prior document (Korean Patent No. 10-1068862) discloses a system for managing energy in real time through a power energy collecting server, which is capable of most efficiently managing energy by monitoring, data-forming, analyzing, and supplying energy consumed in a building for each usage by synchronizing respective sensors for electricity, water supply, gas, cooling/heating, and the like.

However, the existing automatic meter reading (AMR) device, advanced metering infrastructure (AMI), or a digital watt-hour meter has a limit of collecting only information (active power, reactive power, a power factor, a frequency, and the like) on the total power energy amount consumed by a combination of all of the energy usage devices after a point, at which a corresponding power energy collecting server is installed, so that there exists a limitation in analyzing the power consumption amount or a power consumption pattern of the individual energy usage devices to provide detailed energy saving information or control the individual energy usage device through the analysis. In order to monitor or control energy of an individual home appliance using power energy, in general, a plurality of energy measuring devices or hardware for control may be separately installed in each energy usage device for collecting each power information, which has a limit to be considered as a preferable method because of a limitation of an installation place and an increase in an equipment investment.

DISCLOSURE

Technical Problem

In order to solve the aforementioned technical problems, the present invention suggests an energy usage device, which is directly equipped with an energy measuring module within various energy usage devices including a home appliance using power energy, and transmits a code, which is capable of recognizing an individual energy usage device, to a single energy information collecting device through various wired/wireless communication methods whenever the energy usage device is operated, or which is equipped with a module calculating a power consumption characteristic according to an operation of a subordinate component and indirectly estimating energy information within various energy usage devices, and transmits a code, which is capable of recognizing an individual energy usage device, to a single energy information collecting device through various wired/wireless communication methods whenever the energy usage device is operated.

Technical Solution

In order to solve the technical problem, an exemplary embodiment of the present invention provides an energy usage device, including: an energy information generating unit configured to generate energy information containing energy use information measured for an energy usage device or generated in consideration of operations of particular configurations of the device; a communication unit configured to transmit the generated energy information or an identification code for identifying the device to an energy information collecting device; and a control unit configured to control an operation of the energy information generating unit, the communication unit, or the device.

The energy information may contain measured energy information obtained by measuring energy used in the operation of the device and operation condition information about a condition of the operation of the device.

The operation condition information may further include operation mode information of the device or signal pattern information for an operation.

The energy information may be generated in consideration of an energy use pattern according to a combination of the particular configurations for the operation of the device.

The communication unit may receive an operation mode change signal of the device from the energy information collecting device, and the control unit may control the operation of the energy information generating unit, the communication unit, or the device according to the received operation mode change signal.

The energy information collecting device may extract energy information for each device from combined energy information by disaggregating the device by using the received energy information or identification code.

The device may be disaggregated according to a predetermined attribute of the device through a sampling process using the energy information, and the energy information for each device may be extracted from the total amount of power energy of a combination of a plurality of devices according to the disaggregation of the device.

The energy information collecting device may extract energy information for each device by disaggregating the device according to the identification code.

In order to solve the technical problem, an exemplary embodiment of the present invention provides an energy usage server, including: a receiving unit configured to receive energy information containing energy use information measured for an energy use device or energy use information generated in consideration of operations of particular configurations of the device or an identification code for identifying the device; and an extracting unit configured to extract energy information for each device from combined energy information by disaggregating the device by using the received energy information or identification code.

The energy information may contain measured energy information obtained by measuring energy used in the operation of the device and operation condition information about a condition of the operation of the device.

The operation condition information may further include operation mode information of the device or signal pattern information for an operation.

The energy information may be generated in consideration of an energy use pattern according to a combination of the particular configurations for the operation of the device.

The device may be disaggregated according to a predetermined attribute of the device through a sampling process using the energy information, and the energy information for each device may be extracted from the total amount of power energy of a combination of a plurality of devices according to the disaggregation of the device.

The device for collecting energy information may extract energy information for each device by disaggregating the device according to the identification code.

Advantageous Effects

When the energy usage device according to the present invention is used, it is possible to expand an active energy saving solution infrastructure due to ease in extracting and controlling energy use information. Further, it is possible to rapidly expand and realize an energy saving market based on a monitor by a removal of burden of establishing a high-priced system due to the addition of the plurality of individual energy information collecting devices and the control unit, and utilize a standby mode and an operation mode of the output adjustment within various devices, which have not been implemented in a separate control unit based on simple on/off, through the communication of the data packet including a unique product identification code between the central control unit within the individual energy usage device and the energy information collecting device. Further, it is possible to generate an active energy saving algorithm development infrastructure by utilizing various operation modes by a higher system.

Further, it is possible to compare the same kinds of devices by collecting the energy use information for each device through the inherent product identification code of the individual energy usage device, or provide reference information when a user model is changed, or provide various energy saving activity reference information, such as a selection of a high-efficient product group in a decision of an energy policy, by collecting individual device information of a group of the energy use devices.

DETAILED DESCRIPTION

The following description illustrates only a principle of the present invention. Accordingly, a person skilled in the art may invent various apparatuses implementing the principle of the invention and included in a concept and a scope of the invention even though the apparatuses are not clearly described or illustrated in the present specification. It should be further understood that in principal, all conditional terms and exemplary embodiments which are described in the specification are apparently intended to understand the concept of the invention but the present invention is not limited to the exemplary embodiments and states specifically described in the specification.

The aforementioned objects, characteristics, and advantages will be more apparent through the detailed description below related to the accompanying drawings, and thus those skilled in the art to which the present invention pertains will easily carry out the technical spirit of the present invention. Further, in the following description, a detailed explanation of a publicly known technology related to the invention may be omitted when it is determined that the detailed explanation may unnecessarily obscure the subject matter of the present invention. Hereinafter, an exemplary embodiment according to the present invention will be described in detail with reference to the accompanying drawings.

Figure 1:
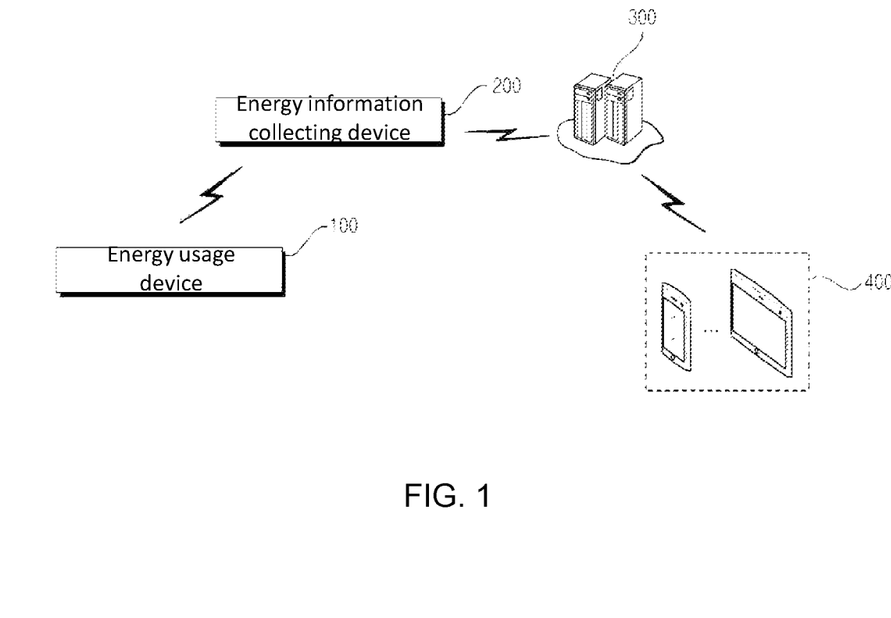
FIG. 1 is a concept diagram illustrating a system for providing energy information including an energy usage device according to an exemplary embodiment of the present invention.

FIG. 1 is a concept diagram illustrating a system for providing energy information including an energy usage device 100 according to an exemplary embodiment of the present invention.

Referring to FIG. 1, the system for providing energy information includes an energy usage device 100, an energy information collecting device 200, an energy information providing server 300, and a user terminal 400.

The energy usage device 100 consumes power energy while performing a supply of power to a driving unit 140 through a command from a control unit 130 in response to a user requirement and performing an operation reflected with an inherent characteristic of each component by a combination of various components within the driving unit 140, and further generates energy information containing energy use information measured for the energy usage device 100 or generated in consideration of operations of particular configurations of a device and transmits the generated energy information to the energy information collecting device 200 together with an identification code for identifying the device.

In the present exemplary embodiment, the energy usage device 100 may include all of the power energy using electric devices (household devices, industrial devices, and the like), such as a refrigerator, a TV, a washing machine, and an LED lighting device, including a central processing unit (CPU, a central controlling unit corresponding to the CPU) as the control unit 130.

The energy information collecting device 200 receives the energy information containing the generated energy use information or the identification code for identifying the device, disaggregating the device by using the received energy information or the identification code, and extracts energy information for each device from combined energy information.

In the present exemplary embodiment, the energy information collecting device 200 is an automatic meter reading (AMR) device, an advanced metering infrastructure (AMI), a digital watt-hour meter, or a micro server product group including a metering function, and may be a gateway function performing device, which is capable of establishing communication with the subordinate energy usage device 100 consuming power energy or a higher system.

The energy information providing server 300 may generate energy use information about the device by using the extracted energy information for each device and transmit the generated energy use information to the user terminal 400, and may be implemented by an open energy IT platform (OEIP) based on a cloud.

Hereinafter, a structure of the energy usage device 100 according to the present exemplary embodiment will be described with reference to FIG. 2 in more detail.

Figure 2:
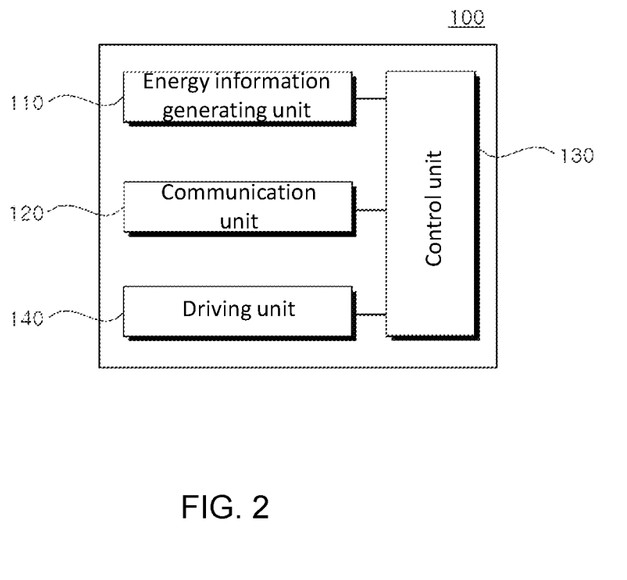
FIG. 2 is a block diagram illustrating the energy usage device according to the exemplary embodiment of the present invention.

FIG. 2 is a block diagram illustrating the energy usage device 100 according to the exemplary embodiment of the present invention.

Referring to FIG. 2, the energy usage device 100 includes an energy information generating unit 110, a communication unit 120, the driving unit 140, and the control unit 130.

The energy information generating unit 110 generates energy information containing energy use information measured for the energy usage device 100 or generated in consideration of operations of detailed configurations of the device.

In the present exemplary embodiment, the energy use information measured for the energy usage device 100 contains general power energy information, such as active power, reactive power, and a power factor, of the entire individual energy usage device 100 including the driving unit 140 obtained by directly measuring a current, a voltage, and the like similar to that obtained by an existing power energy measuring meter, and information about energy use, such as energy use start and end, a use time, an operation mode, a driving signal pattern for an operation, linked with the control unit.

The energy use information generated in consideration of the operations of the particular configurations of the device includes characteristic values of an operation mode and current signal patterns of the energy usage device 100 obtained by estimating general power energy information by indirectly calculating an energy use pattern based on data utilizing a combination of subordinate constituent elements required for an operation of the device based on the energy use information for the constituent component of the individual energy usage device 100, not by directly measuring power energy, as the energy use information for a constituent component of the individual energy usage device 100.

Accordingly, in the present exemplary embodiment, the energy information may further contain operation condition information containing operation mode information or signal pattern information for an operation.

That is, in the present exemplary embodiment, the energy information generating unit 110 is a module for extracting the energy use information about the corresponding energy usage device 100 in the operation of the energy usage device 100, and may perform a method of directly measuring power energy and a method of indirectly measuring power energy as described above.

The communication unit 120 transmits the generated energy information or the identification code for identifying the device to the energy information collecting device 200.

In the present exemplary embodiment, the identification code is a code capable of recognizing the individual energy usage device 100, and may include an inherent model or a product code value (identification code) of a company name of the corresponding device.

Figure 3:
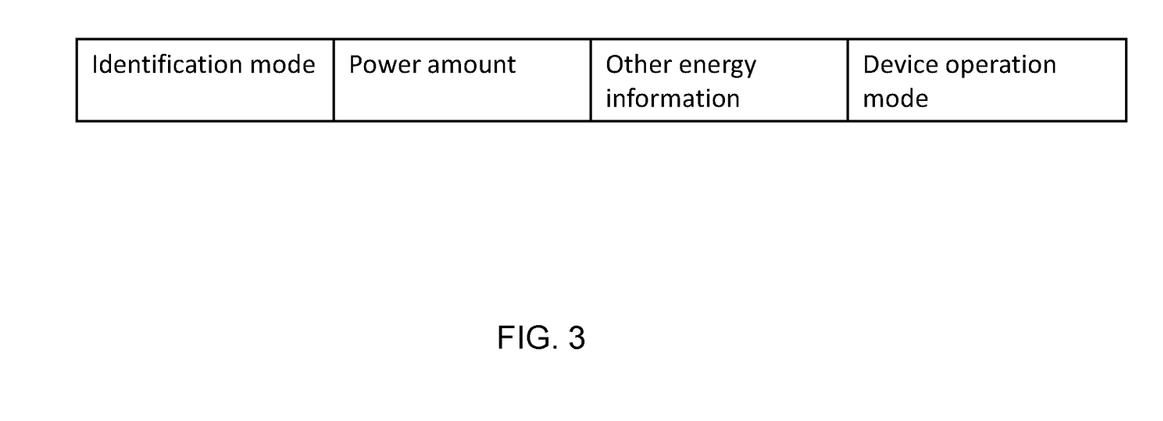
FIG. 3 is a diagram illustrating an example of a structure of a data packet transmitted from the energy usage device to an energy information collecting device according to the exemplary embodiment of the present invention.

That is, a structure of a data packet transmitted from the communication unit 120 of the energy usage device 100 according to the present exemplary embodiment is illustrated in FIG. 3.

Referring to FIG. 3, the data packet transmitted from the energy usage device 100 may be formed of a part storing an identification code, a part storing power amount information, a part storing other energy information, and a part storing device operation mode information.

The part storing the identification code may store an inherent model code and a manufacturing company code of a device as information for recognizing the individual energy usage device 100.

The part storing the power amount information may include values for an active power amount and a reactive power amount, and store general power energy information, such as active power, reactive power, and a power factor, of the entire individual energy usage device 100 including the driving unit 140 generated by directly measuring a current, a voltage, and the like.

The part storing other energy information may store information on an energy use start and end and a use time linked with the control unit 130, or power energy information estimated by indirectly calculating an energy use pattern based on data utilizing a combination of subordinate constituent elements required for an operation of the device based on the energy use information for the constituent component of the individual energy usage device 100.

The part storing the device operation mode information may store information on a device characteristic value, such as an operation mode and a driving signal pattern for an operation.

Further, the communication unit 120 may receive a specific mode change control signal (an output adjustment, a change control of an operation mode, such as a standby mode, and the like, other than simple on/off of the individual device, generated by the uppermost energy management system) of the individual energy usage device 100 transmitted from the energy information collecting device 200 including a smart meter or a meter function, and the control unit 130 may transmit the received control signal to the driving unit 140 and perform a corresponding control operation.

In the present exemplary embodiment, the driving unit 140 is a unit substantially consuming most of the power of the energy usage device 100 consuming power energy, and includes an electronic circuit, a motor, a pump, a lamp, and the like operated for implementing an intrinsic function of the individual energy usage device 100.

Further, the control unit 130 controls an operation of the energy information generating unit 110, the communication unit 120, or the device. That is, the control unit 130 controls an operation for directly/indirectly measuring the energy use information of the energy information generating unit 110 to generate the energy information. Further, the control unit 130 controls the communication unit 120 to transmit the generated energy information to the energy information collecting device 200, and controls the driving unit 140 to perform the intrinsic function of the energy usage device 100. Further, the control unit 130 may control a switching device, which supplies power of the driving unit 140, by receiving a command of the control unit within the energy usage device 100 consuming power energy.

Hereinafter, the energy information collecting device 200 according to the present exemplary embodiment will be described with reference to FIG. 5.

Figure 5:
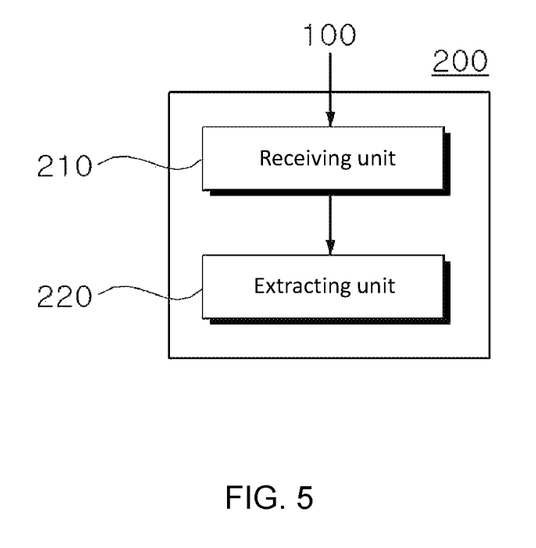
FIG. 5 is a block diagram illustrating a configuration of the energy information collecting device according to the exemplary embodiment of the present invention.

FIG. 5 is a block diagram illustrating a configuration of the energy information collecting device 200 according to the exemplary embodiment of the present invention. Referring to FIG. 5, the energy information collecting device 200 includes a receiving unit 210 and a device-based energy information extracting unit 220.

The receiving unit 210 receives the energy information containing the energy use information measured for the energy usage device 100 or generated in consideration of operations of detailed configurations of the device or the identification code for identifying the device.

That is, the receiving unit 210 receives the energy information directly/indirectly generated by the energy usage device 100 in the aforementioned exemplary embodiment and the identification code of the device through the data packet illustrated in FIG. 3.

The device-based energy information extracting unit 220 extracts energy information for each device from combined energy information by disaggregating the device by using the received energy information or the identification code.

The device-based energy information extracting unit 220 in the present exemplary embodiment is installed at any one point and performs operations of measuring a voltage, a current, and the like of the total power energy amount of the entire individual energy usage devices 100, which are connected after the corresponding point and combined with each other, and generating general power energy information, such as active power, reactive power, a power factor, and a frequency, and receiving a code value and energy information of the individual energy usage device 100 from the plurality of individual energy usage devices 100, and extracting energy information for each device.

In order to extract the energy information for each device, the device-based energy information extracting unit 220 extracts energy use information of each of the individual energy usage devices 100 after the point, at which the energy information collecting device 200 is installed, from the total energy information collected by the energy information collecting device 200 through a device disaggregation procedure utilizing the information received from the individual devices, and transmits the extracted energy use information to a computer, a server, or a cloud.

The disaggregation of the device may be performed through high-speed sampling utilizing additional information about harmonic wave, noise, a transient state, and a normal state of the voltage and the current itself together with basically collected information on a voltage, a current, active power, reactive power, instantaneous power, a power factor, a frequency, and the like.

Otherwise, the energy information extracting unit 220 may easily extract the energy use information of each of the various individual energy use devices 100 through the device disaggregation in a computer, a server, or a cloud by transmitting both the energy information collected by the energy information collecting device 200 and the identification code transmitted from the individual energy usage device 100.

Further, as described above, the energy information collecting device 200 may further include a transmitting unit (not illustrated) transmitting a control signal for controlling the energy usage device 100.

The transmitting unit may receive an operation mode change signal of the individual energy usage device 100 (an output adjustment, a change control of an operation mode, such as a standby mode, and the like, other than simple on/off of the individual device, generated by the uppermost energy management system) and transmit the received operation mode change signal to the control unit 130 of the energy usage device 100.

Figure 4:
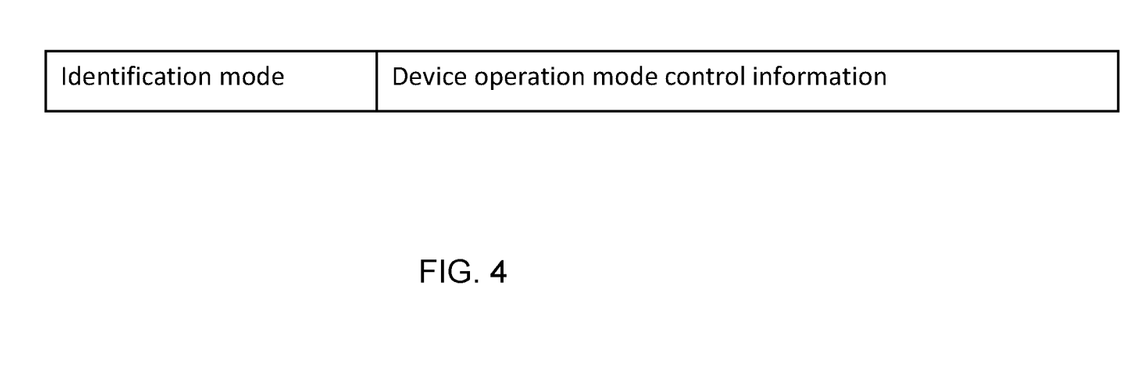
FIG. 4 is a diagram illustrating an example of a structure of a data packet transmitted from the energy information collecting device to the energy usage device according to the exemplary embodiment of the present invention.

In this case, a structure of the transmitted packet is illustrated in FIG. 4. FIG. 4 is a diagram illustrating a structure of the data packet transmitted from the energy information collecting device 200 to the energy usage device 100 according to the exemplary embodiment of the present invention.

Referring to FIG. 4, the data packet may be formed of a part storing an identification code, and a part storing device operation mode control information.

The part storing the identification code may store an inherent model code and a manufacturing company code of a device as information for recognizing the individual energy usage device 100, similar to the aforementioned part storing the identification code of FIG. 3. That is, the part storing the identification code may be utilized as information for confirming whether the received packet is a control signal for the device.

Further, the device operation mode control information may contain command information for setting an operation mode or sequence information for controlling the device as an operation mode change signal of the device.

Hereinafter, an energy information providing server 300, which provides a user with energy information through the energy information for each device received from the energy information collecting device 200 will be described. In the present exemplary embodiment, the energy information providing server 300 transmits individual energy information divided for each of the various energy usage devices 100 and consulting information for an energy saving activity through the individual energy information to the user terminal 400 of a customer through storing, managing, and analyzing the energy information based on the received information. The energy information providing server 300 according to the present exemplary embodiment may be implemented by an open energy IT platform (OEIP) based on a cloud.

Further, the user terminal 400 may be a computer capable of receiving a web support service, or a smart phone or a tablet PC capable of receiving an app support service and a text message support service, and may be a receiver capable of receiving a cable TV/IPTV support service or a POS device capable of receiving a VAN/POS support service.

The energy usage device 100 according to the present invention may expand an active energy saving solution infrastructure due to ease in extracting and controlling energy use information. Further, it is possible to rapidly expand and realize an energy saving market based on a monitor by a removal of burden of establishing a high-priced system due to the addition of the plurality of individual energy information collecting devices and the control unit, and utilize a standby mode and an operation mode of the output adjustment within various devices, which have not been implemented in a separate control unit based on simple on/off, through the communication of the data packet including an inherent product identification code between the central control unit within the individual energy usage device 100 and the energy information collecting device. Accordingly, it is possible to generate an active energy saving algorithm development infrastructure by utilizing various operation modes by a higher system.

Further, it is possible to compare the same kind of devices by collecting the energy use information for each device through the inherent product identification code of the individual energy usage device 100, or provide reference information when a user model is changed, or provide various energy saving activity reference information, such as a selection of a high-efficient product group in a decision of an energy policy, by collecting individual device information of a group of the energy use devices 100.

The above description is simply given for illustratively describing the technical spirit of the present invention, and those skilled in the art will appreciate that various modifications, changes and substitutions are possible, without departing from the essential characteristic of the present invention.

Accordingly, the exemplary embodiment disclosed in the present invention and the accompanying drawings are not intended to limit but describe the technical spirit of the present invention, and the scope of the technical spirit of the present invention is not limited by the exemplary embodiment and the accompanying drawings. The scope of the present invention shall be interpreted by the appended claims and it shall be interpreted that all of the technical spirits in the equivalent range are included in the scope of the present invention.

The invention claimed is:

1. An energy usage device, comprising:
an energy information generating unit configured to generate energy information containing energy use information generated in consideration of operations of particular configurations of the device, the energy use information being estimated from energy use patterns calculated based on combination of energy uses of subordinate components of the device during the operations;
a communication unit configured to transmit a data packet having information in a predetermined format, the information including the generated energy information or an identification code for identifying the device to an energy information collecting device; and
a control unit configured to control an operation of the energy information generating unit, the communication unit, or the device.

2. The energy usage device of claim 1, wherein the energy information contains measured energy information obtained by measuring energy used in the operation of the device and operation condition information about a condition of the operation of the device.

3. The energy usage device of claim 2, wherein the operation condition information further includes operation mode information of the device or signal pattern information for an operation.

4. The energy usage device of claim 1, wherein the communication unit receives an operation mode change signal of the device from the energy information collecting device, and
the control unit controls the operation of the energy information generating unit, the communication unit, or the device according to the received operation mode change signal.

5. The energy usage device of claim 1, wherein the energy information collecting device extracts energy information for each device from combined energy information by disaggregating the device by using the received energy information or identification code.

6. The energy usage device of claim 5, wherein the device is disaggregated according to a predetermined attribute of the device through a sampling process using the energy information, and
the energy information for each device is extracted from the total amount of power energy of a combination of a plurality of devices according to the disaggregation of the device.

7. The energy usage device of claim 5, wherein the energy information collecting device extracts energy information for each device by disaggregating the device according to the identification code.

8. The device of claim 1, wherein the data packet has information including use times or power energy estimates.

9. The device of claim 1, wherein the data packet has information in a predetermined format includes an identification code, a power amount, other energy information, and a device operation mode value.

10. The device of claim 9, wherein the other energy information includes use times or power energy estimates.

11. A device for collecting energy information, comprising:
a receiving unit configured to receive a data packet having information in a predetermined format, the information including energy information containing energy use information generated in consideration of operations of particular configurations of the device or an identification code for identifying the device, the energy use information being estimated from energy use patterns calculated based on combination of energy uses of subordinate components of the device during the operations; and
an extracting unit configured to extract energy information for each device from combined energy information by disaggregating the device by using the received energy information or identification code.

12. The device of claim 11, wherein the energy information contains measured energy information obtained by measuring energy used in the operation of the device and operation condition information about a condition of the operation of the device.

13. The device of claim 12, wherein the operation condition information further includes operation mode information of the device or signal pattern information for an operation.

14. The device of claim 11, wherein the device is disaggregated according to a predetermined attribute of the device through a sampling process using the energy information, and
the energy information for each device is extracted from the total amount of power energy of a combination of a plurality of devices according to the disaggregation of the device.

15. The device of claim 11, wherein the device for collecting energy information extracts energy information for each device by disaggregating the device according to the identification code.

16. The device of claim 11, wherein the data packet has information including use times or power energy estimates.

17. The device of claim 11, wherein the data packet has information in a predetermined format includes an identification code, a power amount, other energy information, and a device operation mode value.

18. The device of claim 17, wherein the other energy information includes use times or power energy estimates.

* * * * *